United States Patent [19]

Skeie

[11] Patent Number: 4,605,929
[45] Date of Patent: Aug. 12, 1986

[54] SURFACE ACOUSTIC WAVE PASSIVE TRANSPONDER HAVING OPTIMALLY-SIZED TRANSDUCERS

[75] Inventor: Halvor Skeie, San Jose, Calif.

[73] Assignee: X-Cyte Inc., Mountain View, Calif.

[21] Appl. No.: 509,521

[22] Filed: Jun. 30, 1983

[51] Int. Cl.[4] .................... G01S 13/80; H03H 9/42; H01L 41/04
[52] U.S. Cl. ................................ 343/6.8 R; 333/154; 310/313 B
[58] Field of Search ......... 343/6.5 SS, 6.8 R, 6.8 LC; 310/313 R, 313 B, 313 D; 333/150-155, 193-196

[56] References Cited

U.S. PATENT DOCUMENTS

| | | | |
|---|---|---|---|
| 3,273,146 | 9/1966 | Hurowitz, Jr. | 343/6.8 R |
| 3,706,094 | 12/1972 | Cole et al. | 343/6.8 R X |
| 3,755,803 | 8/1973 | Cole et al. | 343/6.8 R X |
| 4,058,217 | 11/1977 | Vaughan et al. | 209/559 |
| 4,059,831 | 11/1977 | Epstein | 343/6.8 R |
| 4,096,477 | 6/1978 | Epstein et al. | 343/6.5 SS |
| 4,263,595 | 4/1981 | Vogel | 343/6.5 SS |
| 4,307,356 | 12/1981 | Arai | 310/313 D |

Primary Examiner—T. H. Tubbesing
Assistant Examiner—Gilberto Barrón, Jr.
Attorney, Agent, or Firm—Karl F. Milde, Jr.

[57] ABSTRACT

A passive transponder for use in an interrogation/transponder system comprises a substrate having a substrate surface defining a path of travel for surface acoustic waves; a launch transducer element arranged on the surface for converting interrogating signals into surface acoustic waves which propagate along the path of travel; a plurality of tap transducer elements arranged on the surface at spaced intervals along the path of travel for converting surface acoustic waves into respective output signals; and a circuit, connected to the tap transducer elements, for combining the output signals of these transducer elements to form reply signals. In order to maximize energy conversion from the interrogation signals to the reply signals, the launch transducer is made larger than the tap transducers.

6 Claims, 10 Drawing Figures

SURFACE ACOUSTIC WAVE PASSIVE TRANSPONDER HAVING OPTIMALLY-SIZED TRANSDUCERS

CROSS REFERENCE TO RELATED APPLICATIONS

The present application is related in subject matter to the following commonly owned applications for patent:
Application Ser. No. 509,523, filed June 30, 1983, for "System for Interrogating A Passive Transponder Carrying Amplitude and/or Phase Encoded Information" of P. Nysen, H. Skeie and D. Armstrong;
Application Ser. No. 509,522, filed June 30, 1983, for "Apparatus For Compensating Non-Linearities In A Frequency-Modulated Signal" of P. Nysen;
Application Ser. No. 509,525, filed June 30, 1983, for "Surface Acoustic Wave Transponder Having Parallel Acoustic Wave Paths" of H. Skeie;
Application Ser. No. 509,524, filed June 30, 1983, for "Surface Acoustic Wave Passive Transponder Having Non-Reflective Transducers and Pads" of H. Skeie;
Application Ser. No. 509,526, filed June 30, 1983, for "Surface Acoustic Wave Passive Transponder Having Amplitude and Phase Modifying Surface Pads" of H. Skeie;
Application Ser. No. 509,527, filed June 30, 1983, for "Surface Acoustic Wave Passive Transponder Having Acoustic Wave Reflectors" of H. Skeie and P. Nysen.

BACKGROUND OF THE INVENTION

The present invention relates to a "passive interrogator label system" (PILS); that is a system comprising an interrogator for transmitting an interrogation signal, one or more "labels" or passive transponders which produce a reply signal containing coded information in response to the interrogation signal, and a receiver and decoding system for receiving the reply signal and decoding the information contained therein.

A passive interrogator label system of the type to which the present invention relates is disclosed in the U.S. Pat. No. 3,273,146 to Horwitz, Jr.; U.S. Pat. No. 3,706,094 to Cole and Vaughan; U.S. Pat. No. 3,755,803 to Cole and Vaughan; and U.S. Pat. No. 4,058,217 to Vaughan and Cole. In its simplest form, the systems disclosed in these patents include a radio frequency transmitter capable of transmitting RF pulses of electromagnetic energy. These pulses are received at the antenna of a passive transponder and applied to a piezoelectric "launch" transducer adapted to convert the electrical energy received from the antenna into acoustic wave energy in the piezoelectric material. Upon receipt of a pulse, an acoustic wave is generated within the piezoelectric material and transmitted along a defined acoustic path. Further "tap" transducers arranged at prescribed, spaced intervals along this path convert the acoustic wave back into electric energy for reconversion into electrical energy by the launch transducer. The presence or absence of tap transducers at the prescribed locations along the acoustic wave path determines whether a reply pulse will be transmitted with a particular time delay, in response to an interrogation pulse. This determines the informational code contained in the transponder reply.

When an acoustic wave pulse is reconverted into an electrical signal it is supplied to an antenna on the transponder and transmitted as RF electromagnetic energy. This energy is received at a receiver and decoder, preferably at the same location as the interrogating transmitter, and the information contained in this response to an interrogation is decoded.

In the patent application Ser. No. 509,523, filed June 30, 1983, for "System for Interrogating a Passive Transponder Carrying Amplitude and/or Phase Encoded Information" of P. Nysen, H. Skeie, and D. Armstrong, it is proposed to provide an interrogator for transmitting a first, interrogation signal having a first frequency which successively assumes a plurality of frequency values within a prescribed frequency range. This first frequency may, for example, be in the range of 905 to 925 MHz, a frequency band which is freely available in many parts of the world for short range transmission.

The remote, passive transponder associated with this interrogator receives the first signal as an input, and produces a second, reply signal as an output. Signal transforming means within the transponder convert the first signal in such a way as to impart a known informational code in the second signal which is associated with and identifies the particular passive transponder.

Associated with the interrogator of the system is a receiver for receiving the second signal from the passive transponder and a mixer, arranged to receive both the first signal and the second signal, or signals derived therefrom, for mixing together these two signals and thereby producing a further signal. This further signal may, for example, contain the sum and the difference frequencies of the first and the second signals, respectively.

Finally, the proposed system includes a signal processor responsive to the signal produced by the mixer for detecting the frequencies contained in this signal to thereby determine the informational code associated with the passive transponder.

In systems of this general type, considerable signal energy is lost in the transponder because the electrical energy must first be converted into acoustic wave energy and then reconverted back into electrical energy by the launch and tap transducers, respectively. As a result, the reply signal transmitted by the transponder is extremely weak and requires sophisticated receiver and decoder apparatus for extracting the coded information contained in the reply signal.

SUMMARY OF THE INVENTION

It is an object of the present invention to provide a passive transponder adapted for use in an interrogation system for transmitting a reply signal containing encoded information in response to the receipt of an interrogating signal.

It is another object of the present invention to provide a passive transponder of the above-noted type which comprises a substrate having a substrate surface defining a path of travel for acoustic waves; a launch transducer element arranged on the surface for converting the interrogating signal into an acoustic wave which propagates along the path of travel; a plurality of tap transducer elements arranged on the surface at spaced intervals along the path of travel for converting an acoustic wave into respective output signals; and a circuit, connected to the tap transducer elements, for combining the output signals of these transducer elements to form a reply signal.

It is a further object of the present invention to provide a passive transponder of the above-noted type which transmits a reply signal with the maximum amount of energy.

These objects, as well as further objects which will become apparent from the discussion that follows, are achieved, according to the present invention, by making the launch transducer larger than the tap transducers.

In a preferred embodiment of the present invention, the tap transducers are made equal in size whereas the launch transducer is sized with respect to the tap transducers such that:

$$C_1^2 = nC_2^2,$$

where:

n is the number of tap transducers arranged in series along the path of travel of the surface acoustic wave, $C_1$ is the energy coupling coefficient of the launch transducer; and $C_2$ is the energy coupling coefficient of each tap transducer.

For a full understanding of the present invention, reference should now be made to the following detailed description of the preferred embodiments of the invention and to the accompanying drawings.

DESCRIPTION OF THE PREFERRED EMBODIMENTS

Figure 1:
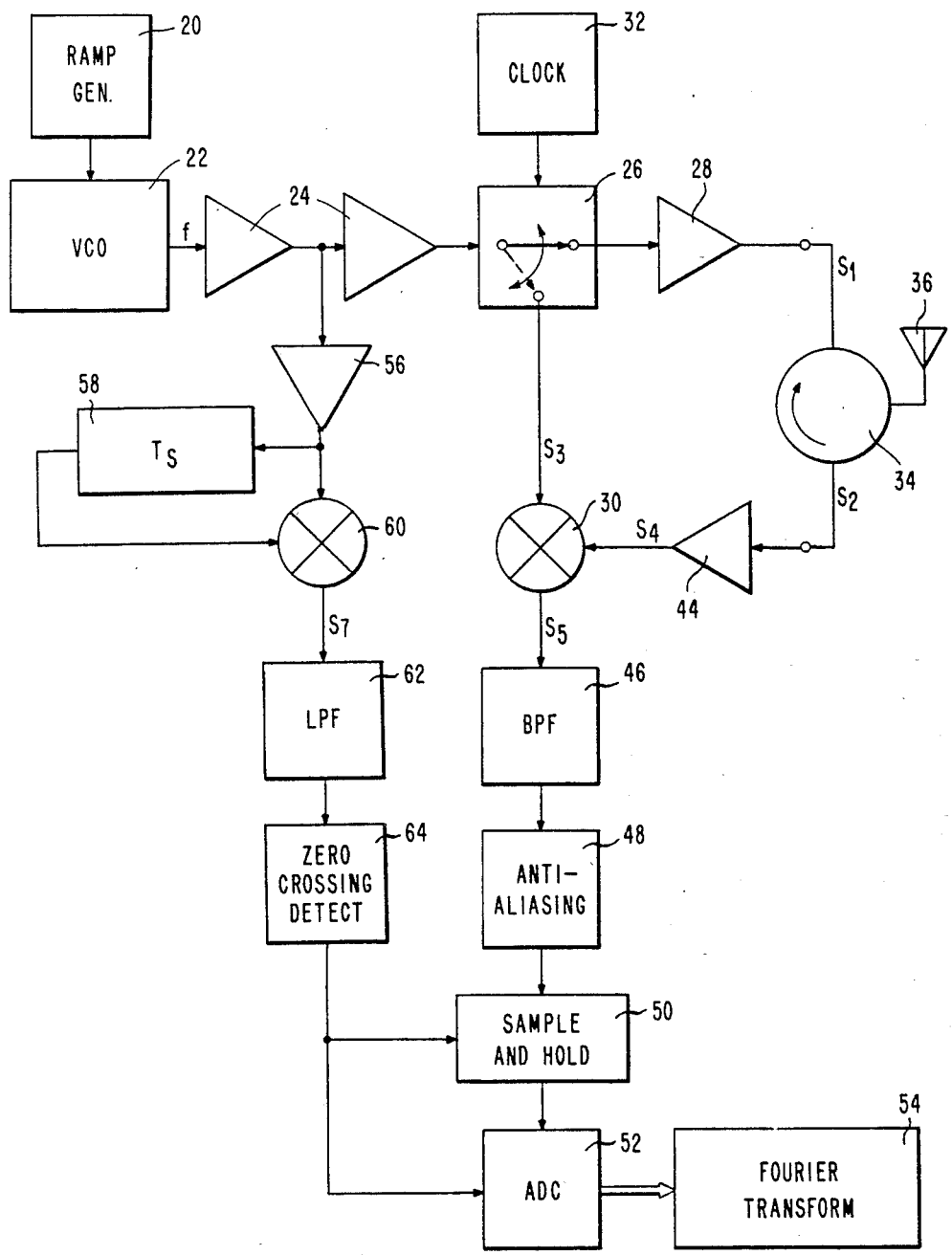
FIG. 1 is a block diagram of a system for transmitting an interrogation signal, receiving a reply signal and decoding information encoded in the reply signal.

The present invention will now be described with reference to FIGS. 1–10 of the drawings. Identical elements in the various figures are designated by the same reference numerals.

FIGS. 1–7 illustrate an interrogator-transponder system employing a surface acoustic wave transponder which may form the environment of the present invention. A system of this general type is disclosed in the U.S. Pat. No. 3,706,094 to Cole and Vaughn. This particular system is described in detail in the commonly-owned patent application Ser. No. 509,523, filed June 30, 1983, for "System for Interrogating a Passive Transponder Carrying Amplitude and/or Phase-Encoded Information" of P. Nysen, H. Skeie and D. Armstrong.

The transmitter/receiver and decoder system shown in FIG. 1 comprises a ramp generator 20 which supplies a sawtooth waveform to a voltage controlled oscillator (VCO) 22. The VCO produces an output signal of frequency f which repeatedly ramps linearly upward from a frequency of 905 MHz to a frequency of 925 MHz. This signal is amplified by the RF amplifiers 24 and supplied to a transmit/receive switch 26. The switch 26 directs the signal either to a transmitter power amplifier 28 or to a decoding mixer 30. The switch 26 is controlled by a 100 KHz square wave signal produced by a clock 32. The output signal $S_1$ from the amplifier 28 is supplied to an external circulator or transmit/receive (TR) switch 34 and is transmitted as electromagnetic radiation by an antenna 36.

Figure 2:
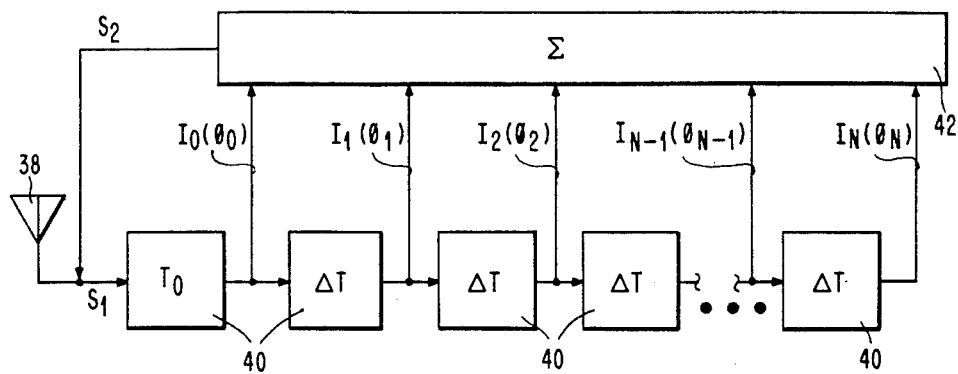
FIG. 2 is a block diagram of a passive transponder adapted for use with the system of FIG. 1.

A block diagram of the transponder associated with the system of FIG. 1 is shown in FIG. 2. The transponder receives the signal $S_1$ at an antenna 38 and passes it to a series of delay elements 40 having the indicated delay periods $T_0$ and $\Delta T$. After passing each successive delay, a portion of the signal $I_0, I_1, I_2 \ldots I_N$ is tapped off and supplied to a summing element 111. The resulting signal $S_2$, which is the sum of the intermediate signals $I_0 \ldots I_N$, is fed back to the antenna 38 for transmission to the antenna 36 in the system of FIG. 1.

The transponder reply signal $S_2$ is received by the antenna 36 and passed through the circulator or IR switch 34 to a receiver amplifier 44. The output $S_4$ of this amplifier 44 is heterodyned in the mixer with the signal $S_3$ intermittently presented by the switch 26.

The output $S_5$ of the mixer 30 contains the sum and the difference frequencies of the signals $S_3$ and $S_4$. This output is supplied to a band pass filter 46 with a pass band between 1 and 3 KHz. The output of this filter is passed through an anti-aliasing filter 48 to a sample-and-hold circuit 50.

The sample-and-hold device supplies each sample to an analog-to-digital converter 52. The A/D converter, in turn, presents the digital value of this sample to a processor 54 that analyzes the frequencies contained in the signal by means of a Fourier transform. The sample-and-hold device 50 and the A/D converter 52 are strobed by a sampling signal which serves to compensate for the non-linearity, with respect to time, in the monotonically increasing frequency f of the VCO output signal.

To effect compensation the signal of frequency f produced by the VCO 22 is passed via an isolating amplifier 56 to a delay element 58 with a constant signal delay $T_s$. Both the delayed and the undelayed signals are supplied to a mixer 60 which produces a signal $S_7$ containing both sum and difference frequencies. The signal $S_7$ is supplied to a low-pass filter 62 which passes only the portion of this signal containing the difference fequencies. The output of the low-pass filter is supplied to a zero-crossing detector 64 which produces a pulse at each positive (or negative) going zero crossing. These pulses are used to strobe the sample-and-hold device 50 and the A/D converter 52.

Figure 3:
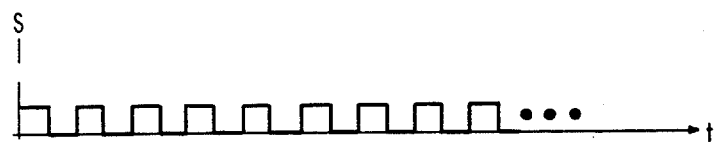
FIG. 3 is a timing diagram indicating the clock output in the system of FIG. 1.
Figure 4:
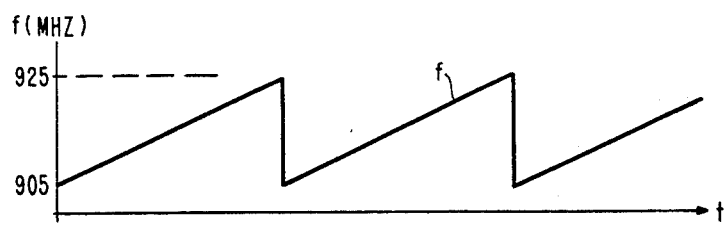
FIG. 4 is a frequency vs. time diagram illustrating the transmitted signal in the system of FIG. 1.
Figure 5:
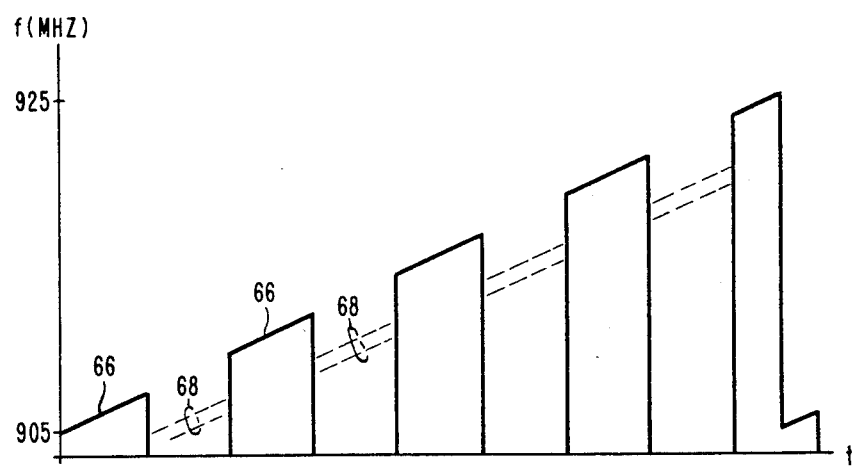
FIG. 5 is a frequency vs. time diagram illustrating both the transmitted and the received signal in the system of FIG. 1.

FIGS. 3–5 illustrate the operation of the circuit of FIG. 1. FIG. 3 shows the 100 KHz output of the clock 32; FIG. 4 shows the frequency sweep of the signal produced by the VCO 22. FIG. 5 shows, in solid lines 66, the frequency of the transmitted signal $S_1$ and, in dashed lines 68, the frequency of the signal $S_2$ as received from the transponder. As may be seen, the signal 68 is received during the interval between transmissions of the signal 66. These intervals are chosen to equal, approximately, the round trip delay time between the transmission of a signal to the transponder and the receipt of the transponder reply. As indicated by the multiple dashed lines, the transponder reply will contain a number of frequencies at any given instant of time as a result of the combined (i.e., summed) intermediate signals having different delay times ($T_0$, $T_0 + \Delta T$, $T_0 + 2\Delta T$, ... $T_0 + N\Delta T$).

Figure 6:
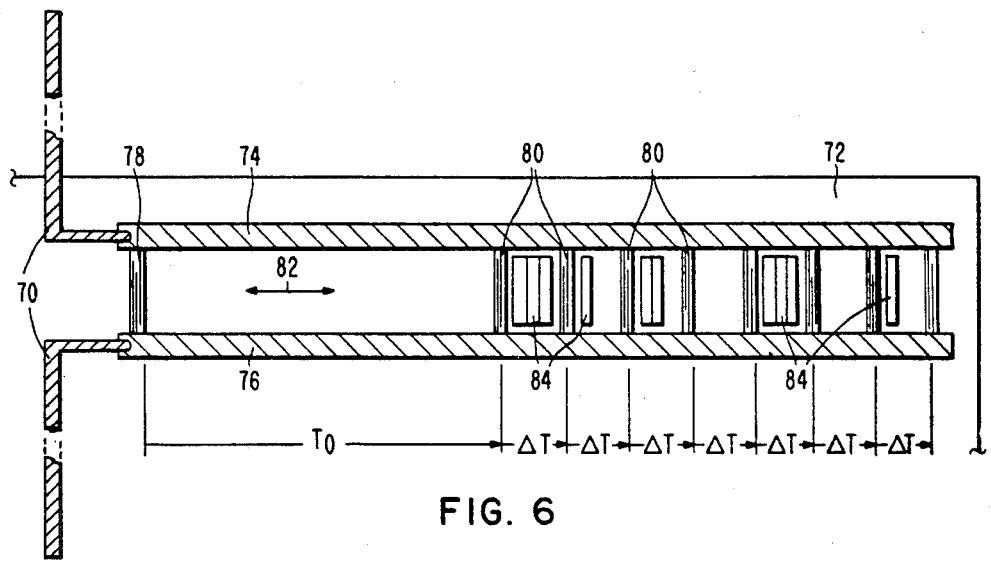
FIG. 6 is a plan view, in enlarged scale, of a particular implementation of the transponder of FIG. 2.
Figure 7:
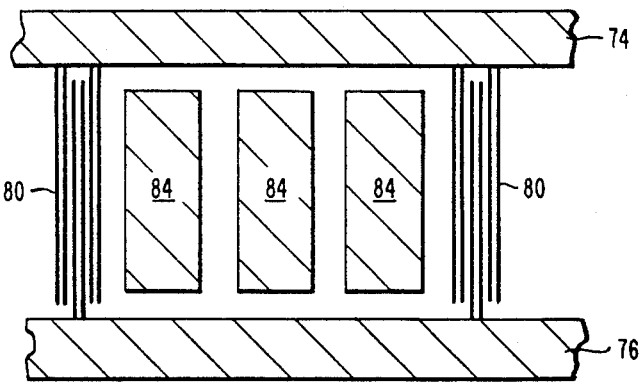
FIG. 7 is a plan view, in greatly enlarged scale, of a portion of the implementation shown in FIG. 6.

FIGS. 6 and 7 illustrate an embodiment of a passive transponder which implements the block diagram of FIG. 2. This transponder operates to convert the received signal $S_1$ into an acoustic wave and then to reconvert the acoustic energy back into an electrical signal $S_2$ for transmission via a dipole antenna 70. More particularly, the signal transforming element of the transponder includes a substrate 72 of piezoelectric material such as a lithium niobate ($LiNbO_3$) crystal. On the surface of this substrate is deposited a layer of metal, such as aluminum, forming a pattern such as that shown in detail in FIG. 7. For example, this pattern may consist of two bus bars 74 and 76 connected to the dipole antenna 70, a "launch" transducer 78 and a plurality of "tap" transducers 80. The bars 74 and 76 thus define a path of travel 82 for an acoustic wave which is generated by the launch transducer and propogates substantially linearly, reaching the tap transducers each in turn. The tap transducers convert the acoustic wave back into electrical energy which is collected and therefore summed by the bus bars 74 and 76. This electrical energy then activates the dipole antenna 70 and is converted into electromagnetic radiation for transmission as the signal $S_2$.

The tap transducers 80 are provided at equally spaced intervals along the acoustic wave path 82, as shown in FIG. 6, and an informational code associated with the transponder is imparted by providing a selected number of "delay pads" 84 between the tap transducers. These delay pads, which are shown in detail in FIG. 7, are preferably made of the same material as, and deposited with, the bus bars 74, 76 and the transducers 78, 80. Each delay pad has a width sufficient to delay the propagation of the acoustic wave from one tap transducer 80 to the next by one quarter cycle or 90° with respect to an undelayed wave at the frequency of operation (circa 915 MHz). By providing locations for three delay pads between successive tap transducers, the phase $\phi$ of the acoustic wave received by a tap transducer may be controlled to provide four phase possibilities:

1. No pad between successive tap transducers = $-90°$;
2. One pad between successive tap transducers = $0°$;
3. Two pads between successive tap transducers = $+90°$
4. Three pads between successive tap transducers = $+180°$.

Referring to FIG. 2 the phase information $\phi_0$ (the phase of the signal picked up by the first tap transducer in line), and $\phi_1$, $\phi_2$ ... $\phi_N$ (the phases of the signals picked up by the successive tap transducers) is supplied to the combiner (summer) which in the embodiment of FIG. 6 comprises the bus bars 74 and 76. This phase information, which is transmitted as the signal $S_2$ by the antenna 70, contains the informational code of the transponder.

Figure 8:
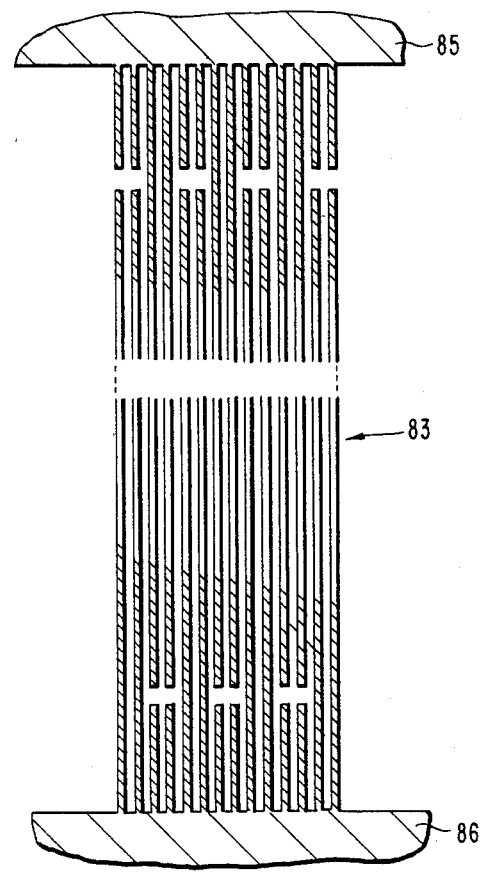
FIG. 8 is a plan view, in greatly enlarged scale, of a transducer element of the type employed in the implementation of FIG. 6.

A typical electromechanical transducer for converting an electrical signal into an acoustic wave and vice versa is illustrated in FIG. 8. This transducer is arranged between two bus bars 85 and 86 and may be utilized either as a launch transducer or a tap transducer in the embodiments of the invention.

The transducer comprises an interdigital electrode assembly 83 formed of individual electrode fingers. In the illustrated pattern, half the fingers are connected to the bus bar 85 and the other half are connected to the bus bar 86. Each electrode is connected to one or the other bus bar and extends toward a free end in the direction of the other bus bar.

It will be appreciated that the size of the transducer is expandable at will be merely adding electrode fingers in the same pattern shown. The size of the transducer is thus determined by the number of fingers arranged in parallel.

Figure 9:
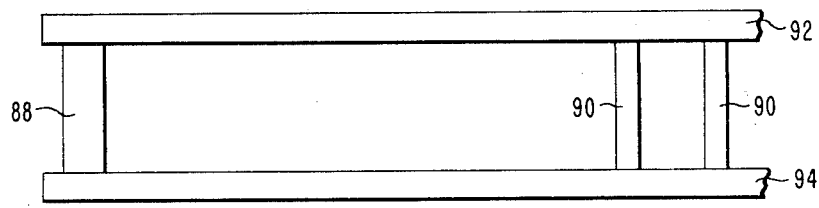
FIG. 9 is a plan view, in enlarged scale, of the bus bar and transducer pattern in one preferred embodiment of the present invention.

FIG. 9 shows a portion of a bus bar/transducer embodiment in which the launch transducer 88 is larger (wider) than the equally sized tap transducers 90. Similarly, FIG. 10 illustrates an embodiment wherein the launch transducer 96 is larger than the closest tap transducer 98; however, the tap transducers 98, 100, 102, 104 ... increase in size the farther they are away from the launch transducer.

The term "size" of a transducer, as used herein, is intended to denote the relative amount of energy the transducer is capable of coupling into and out of a piezoelectric substrate. This relative amount of energy is denominated by a factor C, the energy coupling coefficient of the transducer. This coefficient C specifies the ratio of (1) the energy coupled into the substrate as a surface acoustic wave; and (2) the electrical energy applied to the transducer. The coefficient C applies also to the energy coupled out of the piezoelectric substrate; that is, the ratio of (1) the electrical energy induced into a transducer by a surface acoustic wave; and (2) the total surface acoustic wave energy passing under a transducer. The energy coupling in both directions (in and out) is substantially the same and results in a loss of about 3 db in each direction.

Figure 10:
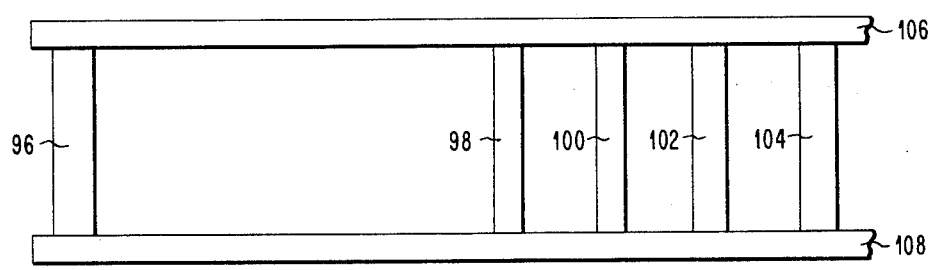
FIG. 10 is a plan view, in enlarged scale, of the bus bar and transducer pattern in another preferred embodiment of the present invention.

If the bus bars 92 and 94 in FIG. 9 and 106 and 108 in FIG. 10 are parallel and if the transducers have equally dimensioned fingers, the sizes of the transducers are determined entirely by their widths.

Considering the embodiment of FIG. 9 and assuming that a pulse of energy (amplitude normalized to 1) is applied to the bus bars 92 and 94 at time $t=0$, the signal received at these bus bars at a time $t=\tau$ later will be equal to:

$$C_1 \cdot C_2 + C_2 \cdot C_1,$$

where $C_1$ is the energy coupling coefficient of the launch transducer;
$C_2$ is the energy coupling coefficient of the first tap transducer; and
$\tau$ is the time it takes for a surface acoustic wave to travel from the launch transducer to the first tap transducer or vice versa.

The first term in the expression above gives the signal amplitude or energy fed into the launch transducer and received by the tap transducer. The second term gives the signal amplitude or energy fed into the tap transducer and received by the launch transducer.

Thus, the resulting pulse out will have a signal amplitude equal to $$2C_1 \cdot C_2,$$

and a power equal to $$4C_1^2 \cdot C_2^2.$$

Now, again assuming a normalized signal (amplitude=1), the power into the device will equal:

$$1^2 = C_1^2 + nC_2^2$$

$$C_1^2 = 1 - nC_2^2,$$

where n is the number of tap transducers.
Since the power out $=4C_1^2 \cdot C_2^2$ (previously calculated), this power is also equal to:

$$4(1 - nC_2^2)C_2^2.$$

To maximize the power out we set the derivative of this expression equal to zero.

$$2C_2(1 - nC_2^2) + C_2^2(-2nC_2) = 0$$

$$1 - 2nC_2^2 = 0$$

$$2nC_2^2 = 1$$

$$C_2^2 = \frac{1}{2}n$$

Since $$1 = C_1^2 + nC_2^2,$$

$$C_2^1 = 1 - \frac{n}{2n} = \frac{1}{2},$$

$$C_2^2/C_1^2 = \frac{1}{2n} / \frac{1}{2} = \frac{1}{n}, \text{ and thus}$$

$$C_1^2 = nC_2^2.$$

There has thus been shown and described a novel surface acoustic wave passive transponder, having optimally sized transducers, which fulfills all the objects and advantages sought therefor. Many changes, modifications, variations and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. In a passive transponder adapted for use in an interrogation system for transmitting a reply signal containing coded information in response to the receipt of an interrogating signal, said transponder comprising:
 (a) a substrate having a substrate surface defining a path of travel for surface acoustic waves;
 (b) a launch transducer arranged on said surface for converting said interrogating signal into a surface acoustic wave which propagates along said path of travel;
 (c) a plurality of tap transducers arranged on said surface at spaced intervals along said path of travel for converting said surface acoustic wave into respective output signals; and
 (d) circuit means connected to said tap transducers for combining said output signals to form said reply signal;
 the improvement wherein said launch transducer and the one of said tap transducers closest to said launch transducer are sized such that $C_1^2$ is substantially equal to $nC_2^2$ where:
 n is the number of tap transducers arranged in series along said path of travel;
 $C_1$ is the energy coupling coefficient of said launch transducer; and
 $C_2$ is the energy coupling coefficient of said one tap transducer.

2. The improvement defined in claim 1, wherein said tap transducers are of equal size.

3. The improvement defined in claim 1, wherein said tap transducers increase in size the farther they are away from said launch transducer.

4. The improvement defined in claim 1, wherein said transducers comprise a plurality of parallel interdigital fingers, and wherein said size of each transducer is determined by its number of fingers.

5. In a passive transponder adapted for use in an interrogation system for transmitting a reply signal containing coded information in response to the receipt of an interrogating signal, said transponder comprising:
 (a) a substrate having a substrate surface defining a path of travel for surface acoustic waves;
 (b) a launch transducer arranged on said surface for converting said interrogating signal into a surface acoustic wave which propagates along said path of travel;
 (c) a plurality of tap transducers arranged on said surface at spaced intervals along said path of travel for converting said surface acoustic wave into respective output signals; and
 (d) circuit means connected to said tap transducers for combining said output signals to form said reply signal;
 the improvement wherein said launch transducer is larger than the one of said tap transducers closest to said launch transducer, and wherein said tap transducers increase in size the farther they are away from said launch transducer,
 whereby all tap transducers produce output signals of substantially equal energy in response to a surface acoustic wave that propagates along said path of travel.

6. The improvement defined in claim 5, wherein said transducers comprise a plurality of parallel interdigital fingers, and wherein said size of each transducer is determined by the number of fingers thereof.

* * * * *